(12) United States Patent
Lv et al.

(10) Patent No.: US 11,296,160 B2
(45) Date of Patent: Apr. 5, 2022

(54) DISPLAY SUBSTRATE, DISPLAY APPARATUS, AND METHOD OF FABRICATING THE DISPLAY SUBSTRATE

(71) Applicant: BOE Technology Group Co., Ltd., Beijing (CN)

(72) Inventors: Zhijun Lv, Beijing (CN); Liwen Dong, Beijing (CN); Wenqu Liu, Beijing (CN); Xiaoxin Song, Beijing (CN); Zhao Cui, Beijing (CN); Libo Wang, Beijing (CN); Detian Meng, Beijing (CN); Feng Zhang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 60 days.

(21) Appl. No.: 16/769,220

(22) PCT Filed: Dec. 16, 2019

(86) PCT No.: PCT/CN2019/125587
§ 371 (c)(1),
(2) Date: Jun. 2, 2020

(87) PCT Pub. No.: WO2020/199651
PCT Pub. Date: Oct. 8, 2020

(65) Prior Publication Data
US 2021/0233980 A1    Jul. 29, 2021

(30) Foreign Application Priority Data
Mar. 29, 2019 (CN) .......................... 201910250519.8

(51) Int. Cl.
*H01L 27/32* (2006.01)
*H01L 51/52* (2006.01)
*H01L 51/56* (2006.01)

(52) U.S. Cl.
CPC ...... *H01L 27/3246* (2013.01); *H01L 27/3218* (2013.01); *H01L 27/3283* (2013.01); *H01L 51/5271* (2013.01); *H01L 51/56* (2013.01)

(58) Field of Classification Search
CPC .................. H01L 27/3246; H01L 51/5271
See application file for complete search history.

(56) References Cited

U.S. PATENT DOCUMENTS 11,133,353 B2 * 9/2021 Gong .................. H01L 51/5271
11,196,016 B2 * 12/2021 Huangfu ............. H01L 51/5209
(Continued)

FOREIGN PATENT DOCUMENTS

CN      104425766 A     3/2015
CN      204391161 U     6/2015
(Continued)

OTHER PUBLICATIONS

Second Office Action in the Chinese Patent Application No. 201910250519.8, dated Feb. 10, 2021; English translation attached.
(Continued)

*Primary Examiner* — Victoria K. Hall
(74) *Attorney, Agent, or Firm* — Intellectual Valley Law, P.C.

(57) ABSTRACT

A display substrate is provided. The display substrate includes a base substrate; a pixel definition structure on the base substrate; a plurality of light emitting elements respectively in a plurality of first apertures; and a reflective layer at least partially in a respective one of the plurality of first apertures and configured to reflect light laterally emitted from a respective one of the plurality of light emitting elements to exit from a light emitting surface of the respective one of the plurality of light emitting elements. The pixel definition structure includes a first pixel definition layer on the base substrate, and a second pixel definition layer on a (Continued)

side of the first pixel definition layer away from the base substrate. Lateral sides of the first pixel definition layer and the second pixel definition layer have different slope angles with respect to a main surface of the base substrate.

18 Claims, 11 Drawing Sheets

(56) References Cited

U.S. PATENT DOCUMENTS

| | | | | |
|---|---|---|---|---|
| 11,222,937 B2* | 1/2022 | Teraguchi | ............ | H01L 27/3248 |
| 2004/0160165 A1* | 8/2004 | Yamauchi | ............ | H01L 51/5271 |
| | | | | 313/498 |
| 2009/0174320 A1* | 7/2009 | Kim | ............ | H01L 51/5203 |
| | | | | 313/504 |
| 2013/0187163 A1* | 7/2013 | Kim | ............ | H01L 27/3246 |
| | | | | 257/59 |
| 2014/0070182 A1* | 3/2014 | Choi | ............ | H01L 27/3246 |
| | | | | 257/40 |
| 2014/0077174 A1* | 3/2014 | Park | ............ | H01L 51/56 |
| | | | | 257/40 |
| 2014/0284563 A1* | 9/2014 | Baek | ............ | H01L 51/5225 |
| | | | | 257/40 |
| 2014/0306201 A1* | 10/2014 | Yamazaki | ............ | H01L 27/3246 |
| | | | | 257/40 |
| 2014/0361253 A1* | 12/2014 | Choi | ............ | H01L 51/56 |
| | | | | 257/40 |
| 2014/0361265 A1* | 12/2014 | Liu | ............ | H01L 51/5271 |
| | | | | 257/40 |
| 2015/0008403 A1* | 1/2015 | Kudo | ............ | H01L 51/5253 |
| | | | | 257/40 |
| 2015/0060820 A1* | 3/2015 | Takagi | ............ | H01L 27/3246 |
| | | | | 257/40 |
| 2015/0206928 A1* | 7/2015 | Kimura | ............ | H01L 51/5271 |
| | | | | 257/88 |
| 2015/0221893 A1* | 8/2015 | Teraguchi | ............ | H01L 27/3248 |
| | | | | 257/40 |
| 2015/0303407 A1* | 10/2015 | Baek | ............ | H01L 27/3276 |
| | | | | 257/40 |
| 2016/0043161 A1* | 2/2016 | Miyazawa | ............ | H01L 27/3246 |
| | | | | 257/40 |
| 2016/0359142 A1* | 12/2016 | Huangfu | ............ | H01L 27/3283 |
| 2017/0117338 A1* | 4/2017 | Shirahata | ............ | H01L 51/5203 |
| 2017/0125738 A1* | 5/2017 | Kim | ............ | H01L 51/5275 |
| 2017/0133443 A1* | 5/2017 | Nendai | ............ | H01L 51/5206 |
| 2017/0141167 A1* | 5/2017 | Naganuma | ............ | H01L 27/326 |
| 2018/0069062 A1* | 3/2018 | Ma | ............ | H01L 51/5271 |
| 2018/0166648 A1* | 6/2018 | Dai | ............ | H01L 51/5209 |
| 2018/0331325 A1* | 11/2018 | Zhang | ............ | H01L 51/5209 |
| 2019/0067394 A1* | 2/2019 | Cheon | ............ | H01L 51/5209 |
| 2019/0067625 A1* | 2/2019 | Yu | ............ | H01L 51/5203 |
| 2019/0074471 A1* | 3/2019 | Abe | ............ | H01L 51/5209 |
| 2019/0157362 A1* | 5/2019 | Rho | ............ | H01L 51/5268 |
| 2019/0181188 A1* | 6/2019 | Youn | ............ | H01L 51/5253 |
| 2020/0035770 A1* | 1/2020 | Jiang | ............ | H01L 51/502 |
| 2020/0194509 A1* | 6/2020 | Beak | ............ | H01L 27/3258 |
| 2020/0194713 A1* | 6/2020 | Kim | ............ | H01L 51/5218 |
| 2020/0203447 A1* | 6/2020 | Lee | ............ | H01L 27/3258 |
| 2021/0057671 A1* | 2/2021 | Gao | ............ | H01L 51/5271 |
| 2021/0066414 A1* | 3/2021 | Wang | ............ | H01L 27/3246 |
| 2021/0074955 A1* | 3/2021 | Baek | ............ | H01L 51/5253 |
| 2021/0119183 A1* | 4/2021 | Lee | ............ | H01L 51/5209 |
| 2021/0132723 A1* | 5/2021 | Kim | ............ | H01L 51/5271 |
| 2021/0159445 A1* | 5/2021 | Sim | ............ | H01L 51/5265 |
| 2021/0225968 A1* | 7/2021 | Huangfu | ............ | H01L 51/5225 |
| 2021/0327970 A1* | 10/2021 | Zhou | ............ | H01L 51/5209 |
| 2021/0359046 A1* | 11/2021 | Wang | ............ | H01L 27/3258 |

FOREIGN PATENT DOCUMENTS

| | | |
|---|---|---|
| CN | 108336126 A | 7/2018 |
| CN | 109037476 A | 12/2018 |
| CN | 109037493 A | 12/2018 |
| CN | 109166879 A | 1/2019 |
| KR | 20160029491 A | 3/2016 |

OTHER PUBLICATIONS

International Search Report & Written Opinion dated Mar. 18, 2020, regarding PCT/CN2019/125587.
First Office Action in the Chinese Patent Application No. 201910250519.8, dated Jul. 17, 2020; English translation attached.

* cited by examiner

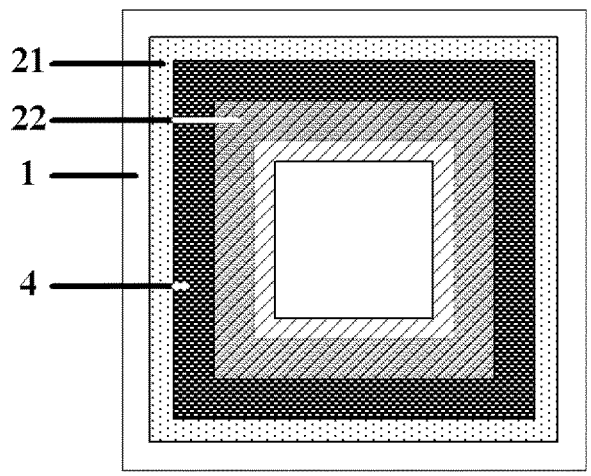
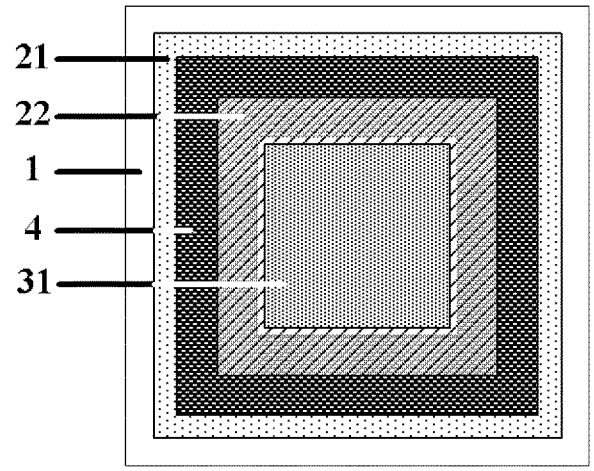
FIG. 2C    FIG. 2D
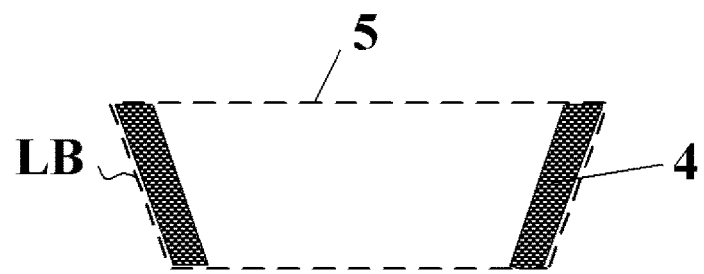
FIG. 2E

DISPLAY SUBSTRATE, DISPLAY APPARATUS, AND METHOD OF FABRICATING THE DISPLAY SUBSTRATE

CROSS-REFERENCE TO RELATED APPLICATION

This application is a national stage application under 35 U.S.C. § 371 of International Application No. PCT/CN2019/125587, filed Dec. 16, 2019, which claims priority to Chinese Patent Application No. 201910250519.8, filed Mar. 29, 2019. Each of the forgoing applications is herein incorporated by reference in its entirety for all purposes.

TECHNICAL FIELD

The present invention relates to display technology, more particularly, to a display substrate, a display apparatus, and a method of fabricating the display substrate.

BACKGROUND

Generally, in an OLED display apparatus, a pixel definition layer (PDL) defines a plurality of subpixel apertures, and each of the subpixel apertures has a light emitting element. The pixel definition layer may absorb light emitted from the light emitting element, resulting in a low light luminous efficiency in the display apparatus. In order to prevent the pixel definition layer from absorbing light emitted from the light emitting element, the pixel definition layer is made of transparent materials, however, light laterally emitted from the light emitting element may transmit out from the pixel definition layer, result in light leakage in the display apparatus.

SUMMARY

In one aspect, the present invention provides a display substrate, comprising a base substrate; a pixel definition structure on the base substrate defining a plurality of first apertures respectively in a plurality of subpixels; a plurality of light emitting elements respectively in the plurality of first apertures; and a reflective layer at least partially in a respective one of the plurality of first apertures and configured to reflect light laterally emitted from a respective one of the plurality of light emitting elements to exit from a light emitting surface of the respective one of the plurality of light emitting elements; wherein the pixel definition structure comprises a first pixel definition layer on the base substrate, and a second pixel definition layer on a side of the first pixel definition layer away from the base substrate; and lateral sides of the first pixel definition layer and the second pixel definition layer have different slope angles with respect to a main surface of the base substrate.

Optionally, the reflective layer is a substantially continuous layer; and a lateral boundary at least partially defining the respective one of the plurality of first apertures in the respective one of the plurality of subpixels substantially surrounds the reflective layer.

Optionally, a width of the respective one of the plurality of first apertures, along a cross-aperture direction across the respective one of the plurality of first apertures and between two light emitting elements directly adjacent to the respective one of the plurality of light emitting elements, increases along a direction from the base substrate to the light emitting surface.

Optionally, a slope angle of a lateral side of the second pixel definition layer is in a range of 50 degrees to 70 degrees.

Optionally, the display substrate further comprises a third pixel definition layer, wherein the third pixel definition layer comprises a plurality of insulating islands respectively in the plurality of first apertures; wherein the respective one of the plurality of light emitting elements comprises a first electrode, a light emitting layer on the first electrode, and a second electrode on a side of the light emitting layer away from the first electrode; and the first electrode is on a side of a respective one of the plurality of insulating islands away from the base substrate, and in the respective one of the plurality of first apertures.

Optionally, a thickness of the respective one of the plurality of insulating islands is less than a combined thickness of the first pixel definition layer and the second pixel definition layer; the thickness of the respective one of the plurality of insulating islands is greater than a thickness of the first pixel definition layer; and a width of the respective one of the plurality of insulating islands, along a cross-aperture direction across the respective one of the plurality of first apertures and between two light emitting elements directly adjacent to the respective one of the plurality of light emitting elements, increases along a direction from the base substrate to the light emitting surface.

Optionally, in the respective one of the plurality of first apertures, the reflective layer is spaced apart from the respective one of the plurality of insulating islands, and spaced apart from the first electrode; and an orthographic projection of the first electrode on the base substrate substantially overlaps with an orthographic projection of the respective one of the plurality of insulating islands on the base substrate.

Optionally, the display substrate further comprises a fourth pixel definition layer, wherein the fourth pixel definition layer comprises a plurality of truncated cones respectively in the plurality of first apertures, and defining a plurality of subpixel apertures; and a respective one of the plurality of truncated cones is between the reflective layer and the respective one of the plurality of insulating islands, and between the reflective layer and the first electrode.

Optionally, a maximum height of the respective one of the plurality of truncated cones with respect to a main surface of the base substrate is equal to or less than a maximum height of the reflective layer with respect to the base substrate; and the respective one of the plurality of truncated cones at least partially covers a lateral side of the reflective layer and insulates the reflective layer from the first electrode.

Optionally, the pixel definition structure comprises a first side away from the base substrate, a second side opposite to the first side, and a lateral side connecting the first side and the second side and defining the respective one of the plurality of first apertures; and the reflective layer is at least partially on the lateral side of the pixel definition structure.

Optionally, the reflective layer extends from the lateral side at least partially onto the first side; and the maximum height of the respective one of the plurality of truncated cones with respect to the main surface of the base substrate is substantially the same as the maximum height of the reflective layer with respect to the main surface of the base substrate.

Optionally, a portion of the first pixel definition layer surrounding the respective one of the plurality of first apertures is not covered by the second pixel definition layer, forming a ring structure having a third side away from the base substrate, a fourth side opposite to the third side, and a fifth side connecting the third side and the fourth side; the third side and the fifth side are at least partially covered by the reflective layer; and the fifth side is part of a lateral side of the first pixel definition layer.

Optionally, the reflective layer is a unitary structure in the plurality of subpixels; a cross-section of the first pixel definition layer in an inter-subpixel region between two adjacent subpixel regions have a first trapezoidal shape in a cross-sectional plane perpendicular to a main surface of the base substrate and intersecting the main surface of the base substrate and the light emitting surface; a cross-section of the second pixel definition layer in the inter-subpixel region have a second trapezoidal shape in the cross-sectional plane; the first trapezoidal shape is stacked on the second trapezoidal shape forming a step structure; and the reflective layer in the cross-sectional plane has a step shape abutting the step structure.

Optionally, the second electrode is electrically connected to the reflective layer.

Optionally, the plurality of insulating islands comprises a negative photoresist material; and the first pixel definition layer comprises a positive photoresist material.

In another aspect, the present invention provides a display apparatus, comprising the display substrate described herein or fabricated by a method described herein, and one or more integrated circuits connected to the display substrate.

In another aspect, the present invention provides a method of fabricating a display substrate, comprising forming a pixel definition structure on a base substrate defining a plurality of first apertures respectively in a plurality of subpixels; forming a plurality of light emitting elements respectively in the plurality of first apertures; and forming a reflective layer at least partially in a respective one of the plurality of first apertures and configured to reflect light laterally emitted from a respective one of the plurality of light emitting elements to exit from a light emitting surface of the respective one of the plurality of light emitting elements; wherein forming the pixel definition structure comprises forming a first pixel definition layer on the base substrate, and forming a second pixel definition layer on a side of the first pixel definition layer away from the base substrate; and lateral sides of the first pixel definition layer and the second pixel definition layer have different slope angles with respect to a main surface of the base substrate.

Optionally, the method further comprises forming a third pixel definition layer comprising a plurality of insulating islands on the base substrate and respectively in the plurality of first apertures.

Optionally, a same mask plate is used for forming the first pixel definition layer, forming the second pixel definition layer, and forming the third pixel definition layer; the third pixel definition layer is formed using a negative photoresist material; and the first pixel definition layer and the second pixel definition layer are formed using a positive photoresist material.

Optionally, the method further comprises forming a fourth pixel definition layer having a plurality of truncated cones respectively in the plurality of first apertures; wherein the respective one of the plurality of truncated cones is formed between the reflective layer and the respective one of the plurality of insulating islands, and between the reflective layer and a first electrode of a respective one of the plurality of light emitting element.

BRIEF DESCRIPTION OF THE FIGURES

The following drawings are merely examples for illustrative purposes according to various disclosed embodiments and are not intended to limit the scope of the present invention.

FIG. 2C is a partial plan view of a pixel definition structure, a fourth pixel definition layer, and a reflective layer in a display substrate in some embodiments according to the present disclosure.

FIG. 2D is a partial plan view of a pixel definition structure, a fourth pixel definition layer, a reflective layer, and a first electrode in a display substrate in some embodiments according to the present disclosure.

FIG. 2E illustrates a reflective layer substantially surrounded by a lateral boundary at least partially defining a respective one of the plurality of first apertures in the respective one of the plurality of subpixels.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, a display substrate, a display apparatus, and a method of fabricating the display substrate that substantially obviate one or more of the problems due to limitations and disadvantages of the related art. In one aspect, the present disclosure provides a display substrate. In some embodiments, the display substrate includes a base substrate; a pixel definition structure on the base substrate defining a plurality of first apertures respectively in a plurality of subpixels; a plurality of light emitting elements respectively in the plurality of first apertures; and a reflective layer at least partially in a respective one of the plurality of first apertures and configured to reflect light laterally emitted from a respective one of the plurality of light emitting elements to exit from a light emitting surface of the respective one of the plurality of light emitting elements. Optionally, the pixel definition structure comprises a first pixel definition layer on the base substrate, and a second pixel definition layer on a side of the first pixel definition layer away from the base substrate. Optionally, lateral sides of the first pixel definition layer and the second pixel definition layer have different slope angles with respect to a main surface of the base substrate.

Figure 1A:
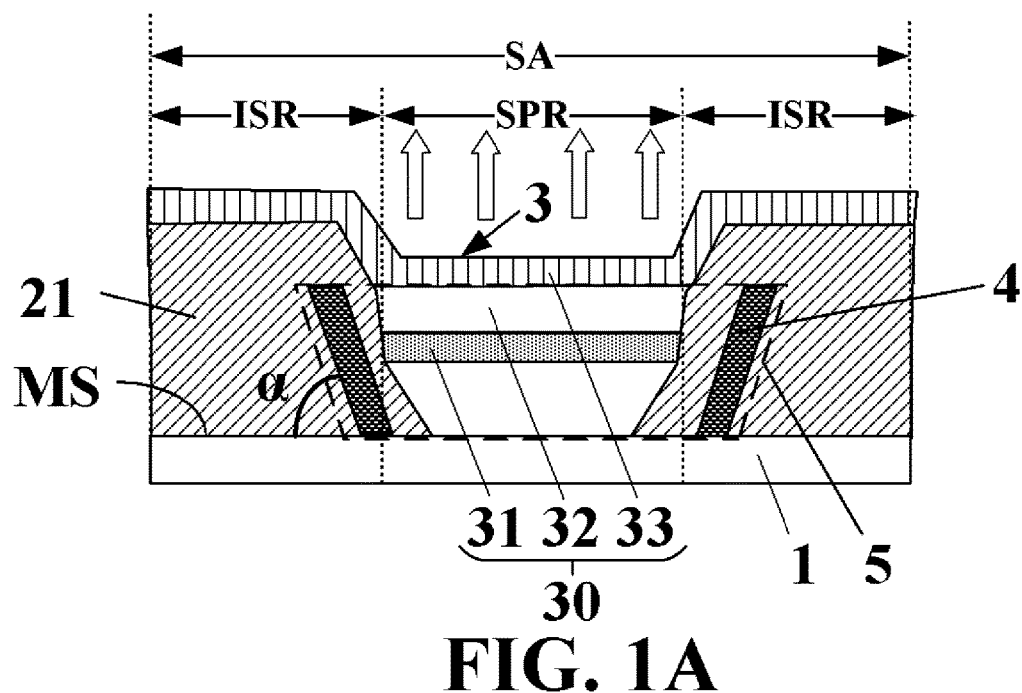
FIG. 1A is a partial cross-sectional view of a display apparatus in some embodiments according to the present disclosure.
Figure 2A:
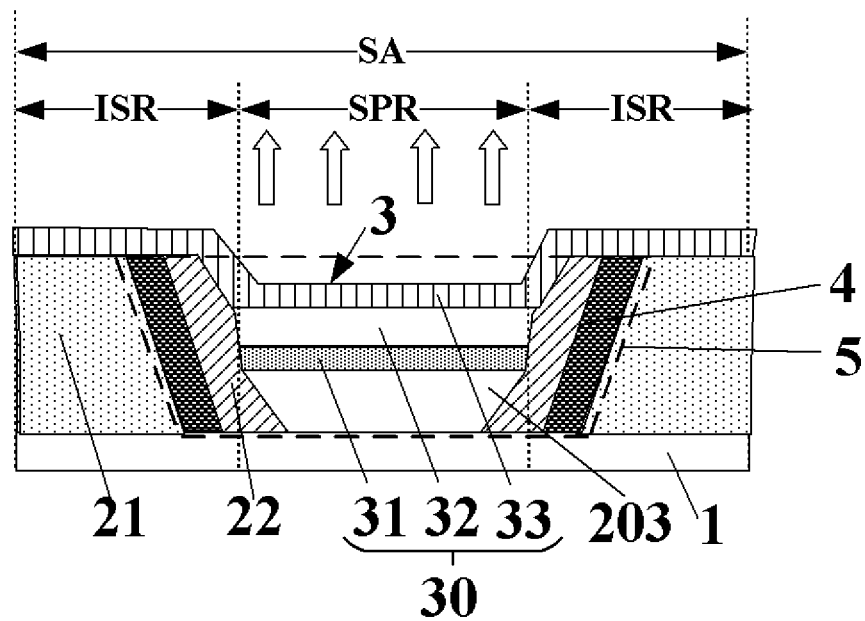
FIG. 2A is a partial cross-sectional view of a display substrate in some embodiments according to the present disclosure.
Figure 3A:
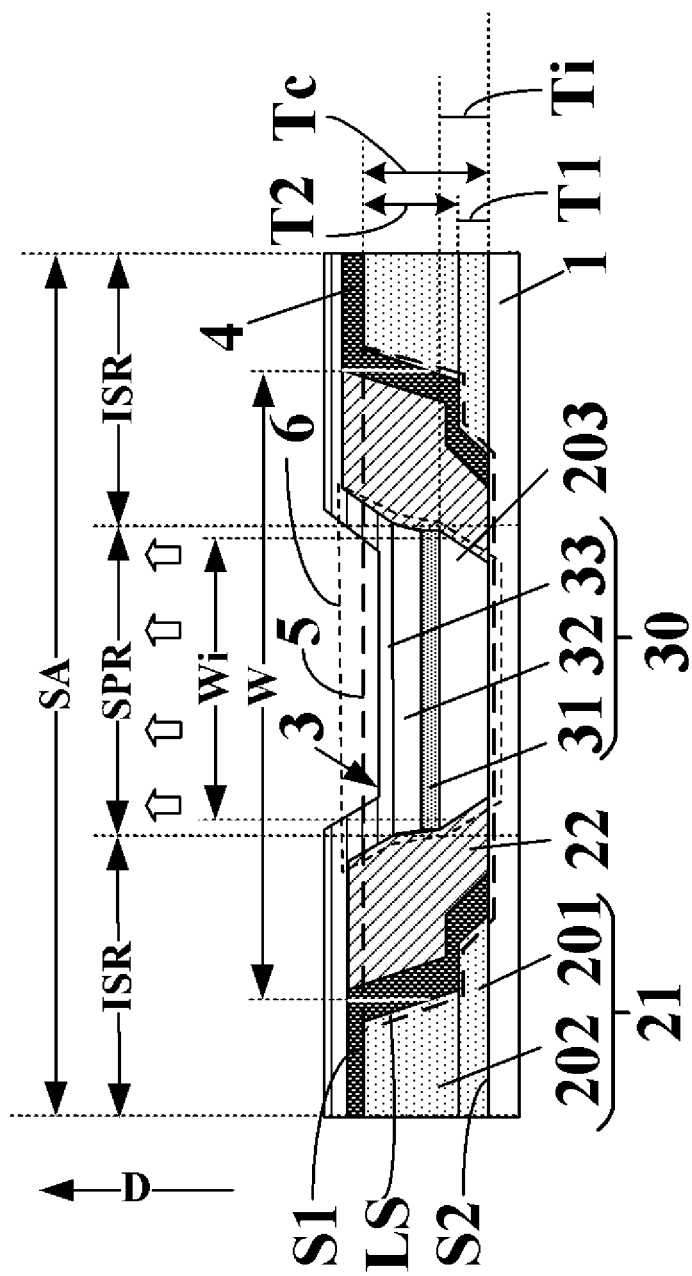
FIG. 3A is a partial cross-sectional view of a display substrate in some embodiments according to the present disclosure.

FIG. 1A is a partial cross-sectional view of a display apparatus in some embodiments according to the present disclosure. FIG. 2A is a partial cross-sectional view of a display substrate in some embodiments according to the present disclosure. FIG. 3A is a partial cross-sectional view of a display substrate in some embodiments according to the present disclosure. In some embodiments, referring to FIG. 1A, FIG. 2A, and FIG. 3A, the display substrate includes a base substrate 1; a pixel definition structure 21 on the base substrate 1 defining a plurality of first apertures 5 respectively in a plurality of subpixels SA; a plurality of light emitting elements 30 respectively in the plurality of first aperture 5. Optionally, a respective one of the plurality of light emitting elements 30 includes a light emitting surface 3.

Optionally, the display substrate includes a plurality of subpixel regions SPR and an inter-subpixel region ISR. Optionally, the base substrate 1 includes a main surface MS closer to the pixel definition structure 21.

As used herein, a subpixel region refers to a light emission region of a subpixel, such as a region corresponding to a pixel electrode in a liquid crystal display, a region corresponding to a light emissive layer in an organic light emitting diode display panel, or a region corresponding to the light transmission layer in the present disclosure. Optionally, a pixel may include a number of separate light emission regions corresponding to a number of subpixels in the pixel. Optionally, the subpixel region is a light emission region of a red color subpixel. Optionally, the subpixel region is a light emission region of a green color subpixel. Optionally, the subpixel region is a light emission region of a blue color subpixel. Optionally, the subpixel region is a light emission region of a white color subpixel.

As used herein, an inter-subpixel region refers to a region between adjacent subpixel regions, such as a region corresponding to a black matrix in a liquid crystal display, a region corresponding a pixel definition layer in an organic light emitting diode display panel, or a black matrix in the present display panel. Optionally, the inter-subpixel region is a region between adjacent subpixel regions in a same pixel. Optionally, the inter-subpixel region is a region between two adjacent subpixel regions from two adjacent pixels. Optionally, the inter-subpixel region is a region between a subpixel region of a red color subpixel and a subpixel region of an adjacent green color subpixel. Optionally, the inter-subpixel region is a region between a subpixel region of a red color subpixel and a subpixel region of an adjacent blue color subpixel. Optionally, the inter-subpixel region is a region between a subpixel region of a green color subpixel and a subpixel region of an adjacent blue color subpixel.

In some embodiments, the display substrate includes a reflective layer 4 at least partially in a respective one of the plurality of first apertures 5 and configured to reflect light laterally emitted from the respective one of the plurality of light emitting elements 30 to exit from a light emitting surface 3 of the respective one of the plurality of light emitting elements 30. For example, the main surface MS of the base substrate 1 is in a plane along a direction crossing over the reflective layer 4, so that light emitted from the respective one of the plurality of light emitting elements 30 and transmitted to the reflective layer 4 is reflected by the reflective layer 4 to the light emitting surface 3.

Optionally, the reflective layer 4 includes a plurality of reflective sub-layers spaced apart from each other. Optionally, the respective one of the plurality of first apertures 5 in the respective one of the plurality of subpixels SA is at least partially defined by a lateral boundary, which substantially surrounds the reflective layer 4. Optionally, the reflective layer 4 is a substantially continuous layer, and the lateral boundary at least partially defining the respective one of the plurality of first apertures 5 in the respective one of the plurality of subpixels SA substantially surrounds the reflective layer 4. Optionally, the reflective layer 4 has a curved shape. Optionally, the reflective layer 4 has a flat shape.

As used herein, the term "substantially surround" refers to surround at least 50% (e.g., at least 60%, at least 70%, at least 80%, at least 90%, at least 95%, at least 99%, or 100%) of a periphery of an object. For example, at least 50% of a periphery of the reflective layer 4 is surrounded by a lateral boundary at least partially defining the respective one of the plurality of first apertures 5 in the respective one of the plurality of subpixels SA. In one example, the reflective layer 4 has a truncated cone-shape structure, and at least 50% of an outer surface of the truncated cone-shape structure is surrounded by a lateral boundary at least partially defining the respective one of the plurality of first apertures 5 in the respective one of the plurality of subpixels SA. FIG. 2E illustrates a reflective layer substantially surrounded by a lateral boundary LB at least partially defining a respective one of the plurality of first apertures in the respective one of the plurality of subpixels. As shown in FIG. 2A and FIG. 2E, an outer surface of the reflective layer 4 abuts the lateral boundary at least partially defining the respective one of the plurality of first apertures 5 in the respective one of the plurality of subpixels SA.

As used herein, the term "substantially continuous" refers a layer having any two points that could be linked though a route on the surface of the layer. In one example, the reflective layer 4 may have a truncated cone-shape structure, the outer surface of the truncated cone-shape structure continuously extends throughout the lateral boundary at least partially defining the respective one of the plurality of first apertures 5 in the respective one of the plurality of subpixels SA.

Figure 1B:
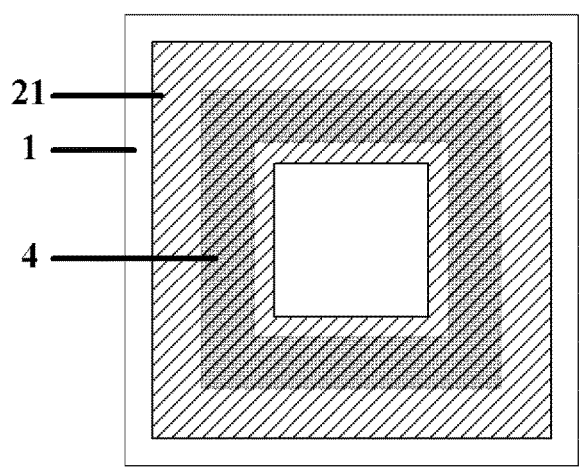
FIG. 1B is a partial plan view of a pixel definition structure and a reflective layer in a display substrate in some embodiments according to the present disclosure.
Figure 1C:
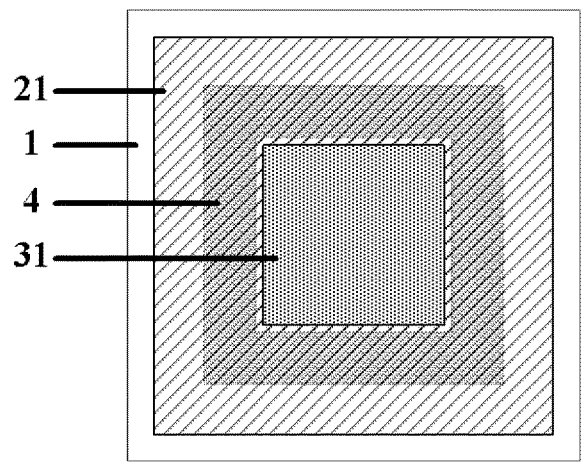
FIG. 1C is a partial plan view of a pixel definition structure, a reflective layer, and a first electrode in a display substrate in some embodiments according to the present disclosure.

FIG. 1B is a partial plan view of a pixel definition structure and a reflective layer in a display substrate in some embodiments according to the present disclosure. FIG. 1C is a partial plan view of a pixel definition structure, a reflective layer, and a first electrode in a display substrate in some embodiments according to the present disclosure. In some embodiments, referring to FIG. 1A, FIG. 1B, and FIG. 1C, the reflective layer 4 is in the respective one of the plurality of subpixels SA has a slope angle α with respect to the main surface MS of the base substrate 1, and the slope angle α is in a range of 30 degrees to 70 degrees, e.g., 30 degrees to 40 degrees, 40 degrees to 50 degrees, 50 degrees to 60 degrees, and 60 degrees to 70 degrees, so that light emitted from the respective one of the plurality of light emitting elements 30 to the reflective layer 4 can be reflected to the light emitting surface 3 of the respective one of the plurality of light emitting elements 30, which may prevent light leakage and improve the light luminous efficiency.

Figure 2B:
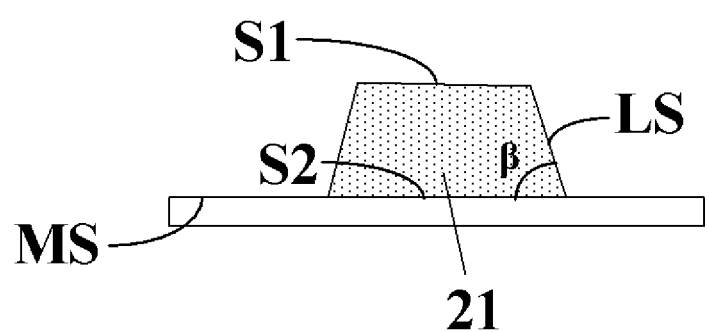
FIG. 2B is a zoom-in view of a pixel definition structure in an inter-subpixel region of a display substrate in some embodiments according to the present disclosure.

FIG. 2B is a zoom-in view of a pixel definition structure in an inter-subpixel region of a display substrate in some embodiments according to the present disclosure. FIG. 2C is a partial plan view of a pixel definition structure, a fourth pixel definition layer, and a reflective layer in a display substrate in some embodiments according to the present disclosure. FIG. 2D is a partial plan view of a pixel definition structure, a fourth pixel definition layer, a reflective layer, and a first electrode in a display substrate in some embodiments according to the present disclosure.

Referring to FIG. 2A to FIG. 2D, in some embodiments, the pixel definition structure 21 includes a first side S1 away from the base substrate 1, a second side S2 opposite to the first side S1, and the lateral side LS connecting the first side S1 and the second side S2 and defining the respective one of the plurality of first apertures 5. For example, the lateral side LS of the pixel definition structure 21 is abutting the respective one of the plurality of first aperture 5 and facing the respective one of the plurality of subpixel regions SPR. Optionally, the lateral side LS of the pixel definition structure 21 is facing the light emitting surface 3 of the respective one of the plurality of light emitting elements 30.

Optionally, the reflective layer 4 is at least partially on the lateral side LS of the pixel definition structure 21. In one example, the reflective layer 4 is partially on the lateral side LS of the pixel definition structure 21. In another example, the reflective layer 4 is completely covering the lateral side LS of the pixel definition structure 21. Optionally, the reflective layer 4 extends from the lateral side LS at least partially onto the first side S1.

Optionally, the lateral side LS of the pixel definition structure 21 is in a plane crossing over the main surface MS of the base substrate 1, so that light emitted from the respective one of the plurality of light emitting elements 30 to the reflective layer 4 can be reflected to the light emitting surface 3 of the respective one of the plurality of light emitting elements 30, which may prevent light leakage and improve the light luminous efficiency.

Optionally, the lateral side LS of the pixel definition structure 21 has a slope angle β with respect to the main surface MS of the base substrate 1. Optionally, the slope angle β of the lateral side LS of the pixel definition structure 21, with respect to the main surface MS of the base substrate 1, is in a range of 30 degrees to 80 degrees, e.g., 30 degrees to 40 degrees, 40 degrees to 50 degrees, 50 degrees to 60 degrees, 60 degrees to 70 degrees, and 70 degrees to 80 degrees, which allows the reflective layer 4 to reflect light back to the light emitting surface 3.

Figure 3B:
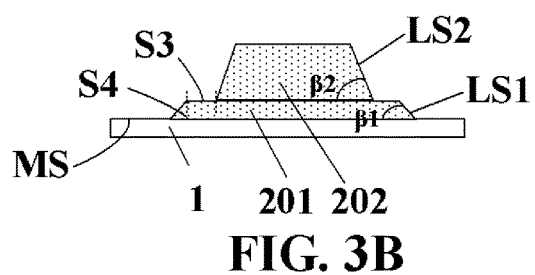
FIG. 3B is a zoom-in view of a pixel definition structure in an inter-subpixel region of a display substrate in some embodiments according to the present disclosure.
Figure 3C:
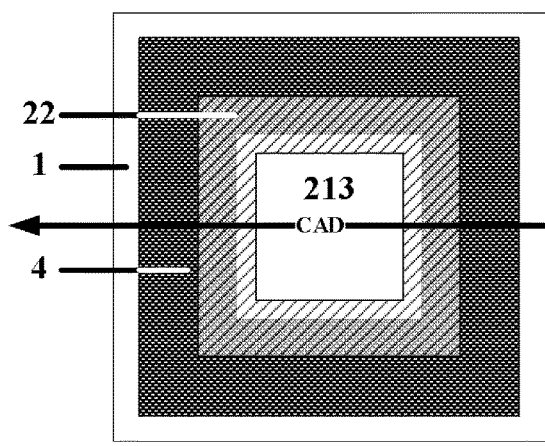
FIG. 3C is a partial plan view of a reflective layer, a third pixel definition layer, and a fourth pixel definition layer in a display substrate in some embodiments according to the present disclosure.
Figure 3D:
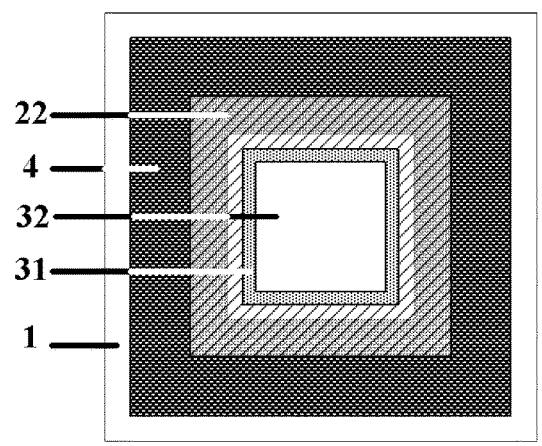
FIG. 3D is a partial plan view of a reflective layer, a fourth pixel definition layer, a light emitting layer, and a first electrode in a display substrate in some embodiments according to the present disclosure.

FIG. 3B is a zoom-in view of a pixel definition structure in an inter-subpixel region of a display substrate in some embodiments according to the present disclosure. FIG. 3C is a partial plan view of a reflective layer, a third pixel definition layer, and a fourth pixel definition layer in a display substrate in some embodiments according to the present disclosure. FIG. 3D is a partial plan view of a reflective layer, a fourth pixel definition layer, a light emitting layer, and a first electrode in a display substrate in some embodiments according to the present disclosure.

Referring to FIG. 3A to FIG. 3D, the display substrate includes a base substrate 1; a pixel definition structure 21 on the base substrate 1 defining a plurality of first apertures 5 respectively in a plurality of subpixels SA; a plurality of light emitting elements 30 respectively in the plurality of first aperture 5. Optionally, a respective one of the plurality of light emitting elements 30 includes a light emitting surface 3.

In some embodiments, the display substrate includes a reflective layer 4 at least partially in a respective one of the plurality of first apertures 5 and configured to reflect light laterally emitted from the respective one of the plurality of light emitting elements 30 to exit from a light emitting surface 3 of the respective one of the plurality of light emitting elements 30. For example, the main surface MS of the base substrate 1 is in a plane along a direction crossing over the reflective layer 4, so that light emitted from the respective one of the plurality of light emitting elements 30 and transmitted to the reflective layer 4 is reflected by the reflective layer 4 to the light emitting surface 3.

Optionally, the reflective layer 4 includes a plurality of reflective sub-layers spaced apart from each other. Optionally, a lateral boundary at least partially defining the respective one of the plurality of first apertures 5 in the respective one of the plurality of subpixels SA substantially surrounds the reflective layer 4. Optionally, the reflective layer 4 is a substantially continuous layer, and the lateral boundary at least partially defining the respective one of the plurality of first apertures 5 in the respective one of the plurality of subpixels SA substantially surrounds the reflective layer 4. Optionally, the reflective layer 4 has a curved shape. Optionally, the reflective layer 4 has a flat shape.

In some embodiments, the pixel definition structure 21 includes a first side S1 away from the base substrate 1, a second side S2 opposite to the first side S1, and the lateral side LS connecting the first side S1 and the second side S2 and defining the respective one of the plurality of first apertures 5. For example, the lateral side LS of the pixel definition structure 21 is abutting the respective one of the plurality of first aperture 5 and facing the respective one of the plurality of subpixel regions SPR. Optionally, the lateral side LS of the pixel definition structure 21 is facing the light emitting surface 3 of the respective one of the plurality of light emitting elements 30.

In some embodiments, the pixel definition structure 21 includes a first pixel definition layer 201 on the base substrate 1, and a second pixel definition layer 202 on a side of the first pixel definition layer 101 away from the base substrate 1.

Optionally, the pixel definition structure 21 extends in the inter-subpixel region ISR, forming a continuous network. Optionally, edges of the pixel definition structure 21 are spaced apart from boundaries of regions corresponding to the plurality of subpixel regions SPR.

Optionally, the second electrode 33 is within the plurality of subpixel regions SPR and covers the light emitting layer 32. Optionally, the minimum height, in the plurality of subpixel regions SPR, of the second electrode 33 with respect to the main surface MS of the base substrate 1 is less than a maximum height, in the plurality of subpixels SA, of the pixel definition structure 21 with respect to the main surface MS of the base substrate 1.

Optionally, the second electrode 33 extends in the inter-subpixel region. For example, the second electrode 33 electrically connected to the reflective layer 4 and covering the reflective layer 4. Optionally, the second electrode 33 is a unitary structure covering the display substrate.

In some embodiments, referring to FIG. 3A and FIG. 3B, the first pixel definition layer 201 has a lateral side LS1 in a plane crossing over the main surface MS of the base substrate 1 and abutting the respective one of the plurality of first apertures 5. The second pixel definition layer 202 has a lateral side LS2 in a plane crossing over the main surface MS of the base substrate 1 and abutting the respective one of the plurality of first apertures 5.

In some embodiments, lateral sides (e.g., LS1 and LS2) of the first pixel definition layer 201 and the second pixel definition layer 202 have different slope angles (e.g., β1 and β2) with respect to the main surface MS of the base substrate 1.

Optionally, a slope angle β2 of the lateral side SL2 of the second pixel definition layer 202 is in a range of 50 degrees to 70 degrees, e.g., 50 degrees to 55 degrees, 55 degrees to 60 degrees, 60 degrees to 65 degrees, and 65 degrees to 70 degrees.

Optionally, a difference between the slope angle β2 of the lateral side SL2 and the slope angle β1 of the lateral side SL1 is in a range of 0 degree to 50 degrees, e.g., 0 degree to 10 degrees, 10 degree to 20 degrees, 20 degree to 30 degrees, 30 degree to 40 degrees, and 40 degree to 50 degrees, which allows the reflective layer 4 to reflect light back to the light emitting surface 3.

Optionally, the slope angle β1 of the lateral side SL1 of the first pixel definition layer 201 is in a range of 30 degrees to 80 degrees, e.g., 30 degrees to 40 degrees, 40 degrees to 50 degrees, 50 degrees to 60 degrees, 60 degrees to 70 degrees, and 70 degrees to 80 degrees, which allows the reflective layer 4 to reflect light back to the light emitting surface 3.

Figure 3E:
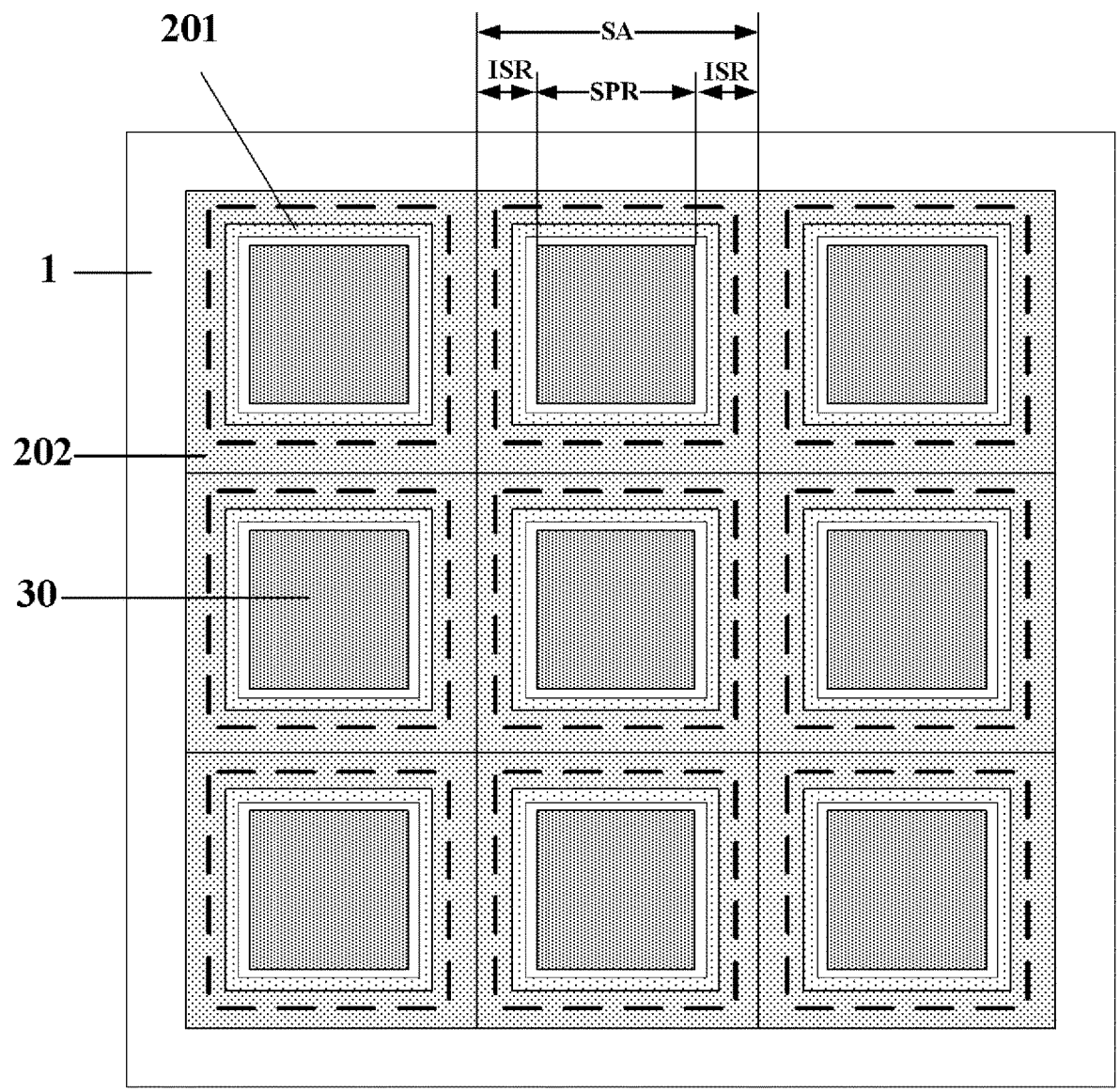
FIG. 3E is a partial plan view of a first pixel definition layer and a second pixel definition layer in some embodiments according to the present disclosure.

In some embodiments, FIG. 3E is a partial plan view of a first pixel definition layer and a second pixel definition layer in some embodiments according to the present disclosure. In some embodiments, referring to FIG. 3A and FIG. 3E, an orthographic projection of the first pixel definition layer 201 on the base substrate 1 covers an orthographic projection of the second pixel definition layer 202 on the base substrate 1.

In some embodiments, referring to FIG. 3A, a width W of the respective one of the plurality of first apertures 5, along a cross-aperture direction CAD shown in FIG. 3C across the respective one of the plurality of first apertures 5 and between two light emitting elements directly adjacent to the respective one of the plurality of light emitting elements 30, increases along a direction D from the base substrate 1 to the light emitting surface 3. Optionally, the cross-aperture direction CAD is parallel to the main surface MS of the base substrate 11.

Optionally, the width W of a portion of the respective one of the plurality of first apertures 5 defined by the first pixel definition layer 201, along the cross-aperture direction CAD, increases along the direction D from the base substrate 1 to the light emitting surface 3.

Optionally, the width W of a portion of the respective one of the plurality of first apertures 5 defined by the second pixel definition layer 202, along the cross-aperture direction CAD, increases along the direction D from the base substrate 1 to the light emitting surface 3.

Figure 3F:
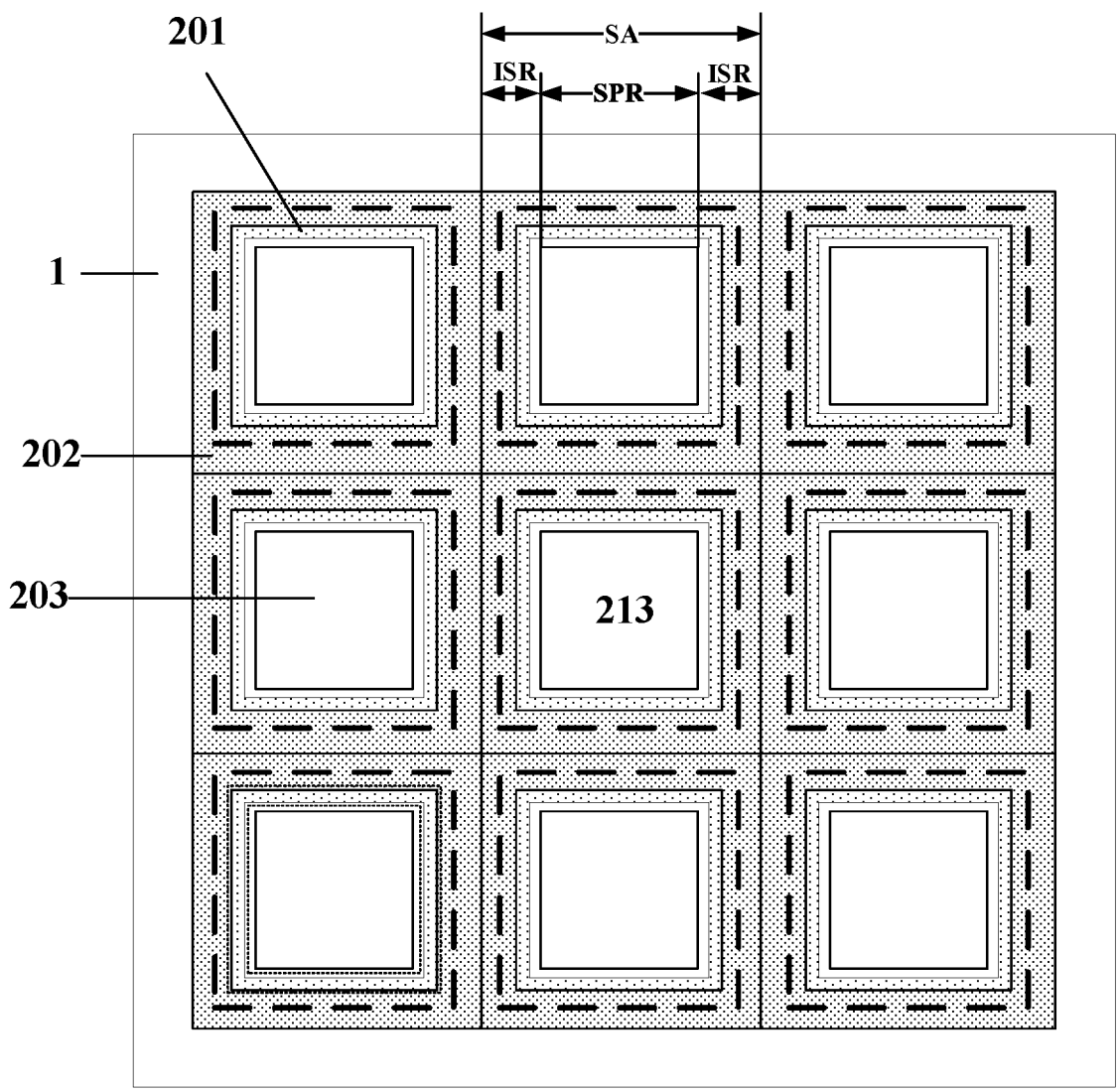
FIG. 3F is a partial plan view of a third pixel definition layer in a display substrate in some embodiments according to the present disclosure.

FIG. 3F is a partial plan view of a third pixel definition layer in a display substrate in some embodiments according to the present disclosure. In some embodiments, referring to FIG. 3A and FIG. F, the display substrate further includes a third pixel definition layer 203. Optionally, the third pixel definition layer 203 includes a plurality of insulating islands 213 respectively in the plurality of first aperture 5.

Optionally, referring to FIG. 3A and FIG. 3F, a thickness Ti of the respective one of the plurality of insulating islands 213 is less than a combined thickness Tc of the first pixel definition layer 201 and the second pixel definition layer 202. Optionally, the thickness Ti of the respective one of the plurality of insulating islands 213 is greater than a thickness T1 of the first pixel definition layer 201. Optionally, the thickness Ti of the respective one of the plurality of insulating islands 213 is less than a thickness T2 of the second pixel definition layer 202.

Optionally, a width Wi of the respective one of the plurality of insulating islands 213, along the cross-aperture direction CAD across the respective one of the plurality of first apertures 5 and between two light emitting elements directly adjacent to the respective one of the plurality of light emitting elements 30, increases along the direction D from the base substrate 1 to the light emitting surface 3.

In some embodiments, referring to FIG. 3A, the respective one of the plurality of light emitting elements 30 includes a first electrode 31, a light emitting layer 32 on the first electrode 31, and a second electrode 33 on a side of the light emitting layer 32 away from the first electrode 31. Optionally, the respective one of the plurality of light emitting elements 30 is a top emission type light emitting element. Optionally, the first electrode 31 and the second electrode 33 are two different electrodes selected from a group consisting an anode and a cathode, for example, the first electrode 31 is an anode, and the second electrode 33 is a cathode.

Optionally, the first electrode 31 is on a side of a respective one of the plurality of insulating islands 213 (e.g., the third pixel definition layer 203) away from the base substrate 1, and in the respective one of the plurality of first apertures 5.

Optionally, the second electrode 33 is electrically connected to the reflective layer 4. Optionally, the second electrode 33 is spaced apart from the reflective layer 4.

Optionally, referring to FIG. 3A and FIG. 3C, in the respective one of the plurality of first apertures 5, the reflective layer 4 is spaced apart from the respective one of the plurality of insulating islands 213.

Optionally, referring to FIG. 3A and FIG. 3D, in the respective one of the plurality of first apertures 5, the reflective layer 4 is spaced apart from the first electrode 31. Optionally, referring to FIG. 3C and FIG. 3D, an orthographic projection of the first electrode 31 on the base substrate 1 substantially overlaps with an orthographic projection of the respective one of the plurality of insulating islands 213 on the base substrate 1. Optionally, the orthographic projection of the first electrode 31 on the base substrate 1 covers an orthographic projection of the light emitting layer 32 on the base substrate 1.

As used herein, the term "substantially overlap" refers to two orthographic projections at least 50%, e.g., at least 60%, at least 70%, at least 80%, at least 90° % at least 95%, at least 99%, and 100%, overlapping with each other.

In some embodiments, referring to FIG. 3A, the display substrate further includes a fourth pixel definition layer 22. Optionally, the fourth pixel definition layer 22 includes a plurality of truncated cones respectively in the plurality of first apertures 5, and defines a plurality of subpixel apertures 6 (shown using densely dashed line in FIG. 3A). Optionally, a respective one of the plurality of truncated cones is between the reflective layer 4 and the respective one of the plurality of insulating islands 213 (e.g., the third pixel definition layer 203), and between the reflective layer 4 and the first electrode 31. For example, a respective one of the subpixel aperture 6 is formed to expose a portion of surface of the first electrode 31 away from the base substrate 1 to accommodate the light emitting layer 32 and the second electrode 33.

Optionally, the respective one of the plurality of truncated cones is between the reflective layer 4 and the light emitting layer 32. Optionally, the respective one of the plurality of truncated cones is between the reflective layer 4 and the second electrode 33.

For example, in the respective one of the plurality of first apertures 5, since the reflective layer 4 is spaced apart from the respective one of the plurality of insulating islands 213 and the first electrode 31 to form a groove between the reflective layer 4 and a combination of the respective one of the plurality of insulating islands 213 and the first electrode 31, and exposing a portion of the surface of the base substrate 1 closer to the reflective layer 4. The fourth pixel definition layer 22 at least partially extends in the groove and spacing apart the reflective layer 4 and the combination of the respective one of the plurality of insulating islands 213 and the first electrode 31.

Figure 3G:
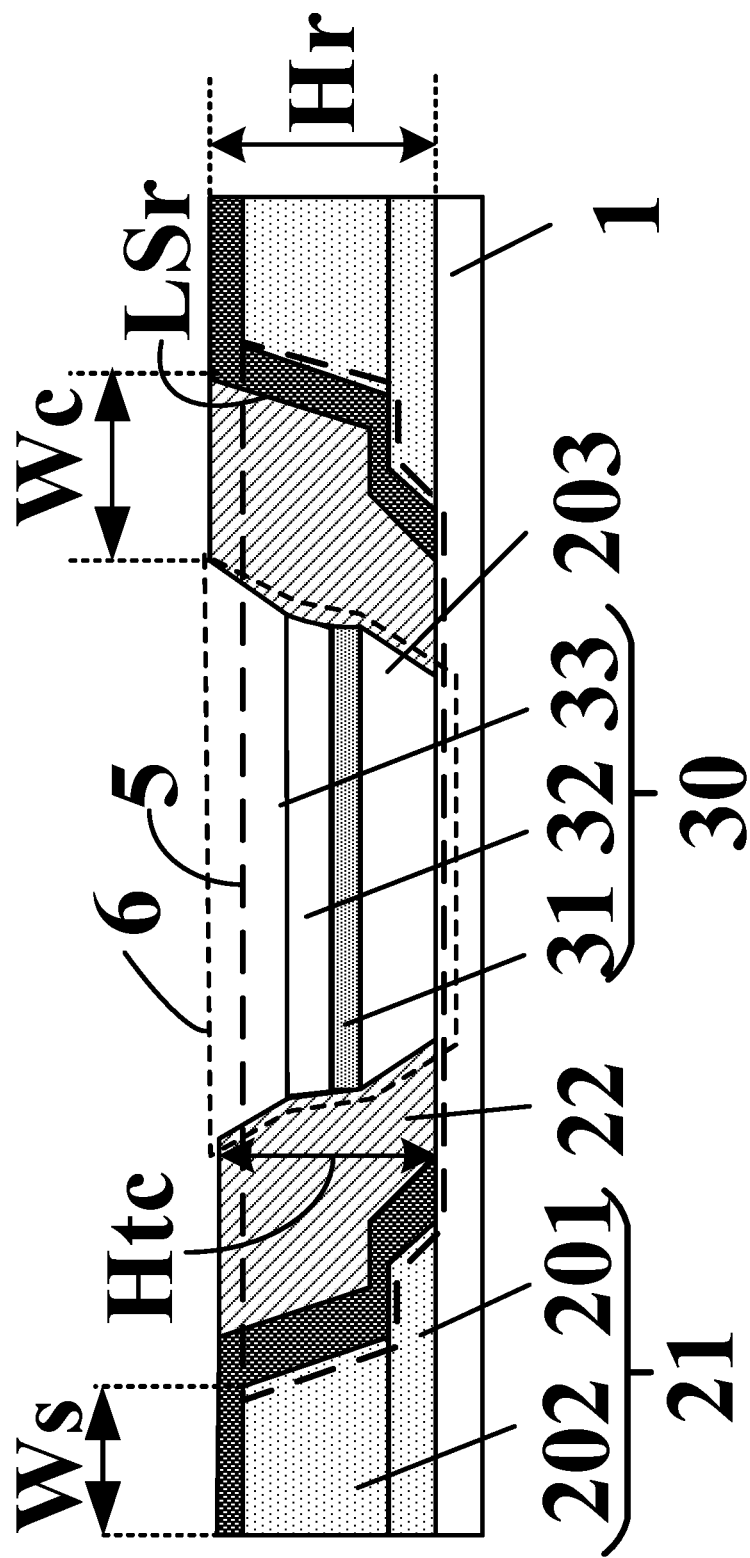
FIG. 3G is a partial cross-sectional view of a reflective layer, a first pixel definition layer, a second pixel definition layer, and a fourth pixel definition layer in some embodiments according to the present disclosure.

FIG. 3G is a partial cross-sectional view of a reflective layer, a first pixel definition layer, a second pixel definition layer, and a fourth pixel definition layer in some embodiments according to the present disclosure. In some embodiments, referring to FIG. 3G, a maximum height Htc of the respective one of the plurality of truncated cones (e.g., the fourth pixel definition layer 22) with respect to the main surface MS of the base substrate 1 is equal to or less than a maximum height Hr of the reflective layer 4 with respect to the base substrate 1.

Optionally, the respective one of the plurality of truncated cones (e.g., the fourth pixel definition layer 22) at least partially covers a lateral side LSr of the reflective layer 4 and insulates the reflective layer 4 from the first electrode 31. In one example, the respective one of the plurality of truncated cones (e.g., the fourth pixel definition layer 22) partially covers the lateral side LSr of the reflective layer 4 and insulates the reflective layer 4 from the first electrode 31. In another example, the respective one of the plurality of truncated cones (e.g., the fourth pixel definition layer 22) completely covers the lateral side LSr of the reflective layer 4 and insulates the reflective layer 4 from the first electrode 31

Optionally, referring to FIG. 3G, a width Wc of the respective one of the plurality of truncated cones (e.g., the fourth pixel definition layer 22) along the cross-aperture direction ACD is relatively small as compared to a width Ws of the pixel definition structure 21 along the cross-aperture direction ACD. By having the Wc relatively small, the respective one of the plurality of light emitting elements can be disposed relatively closer to the reflective layer 4, further minimizing light leakage and improving light luminous efficiency.

In some embodiments, referring to FIG. 3A, the reflective layer 4 is at least partially on the lateral side LS of the respective one of the pixel definition structure 21. In one example, the reflective layer is partially on the lateral side LS of the pixel definition structure 21. In another example, the reflective layer is completely on the lateral side LS of the pixel definition structure 21.

Optionally, the reflective layer 4 extends from the lateral side SL at least partially onto the first side S1. In one example, the reflective layer 4 is partially on the first side S. In another example, the reflective layer 4 is completely on the first side of the S1, to form the unitary structure in the inter-subpixel region ISR.

Optionally, referring to FIG. 3G, the maximum height Htc of the respective one of the plurality of truncated cones (e.g., the fourth pixel definition layer 22) with respect to the main surface MS of the base substrate 1 is substantially the same as the maximum height Hr of the reflective layer 4 with respect to the main surface MS of the base substrate 1.

As used herein, the term "substantially the same" refers to a difference between two values not exceeding 10% of a base value (e.g., one of the two values). e.g., not exceeding 8%, not exceeding 6%, not exceeding 4%, not exceeding 2%, not exceeding 1%, not exceeding 0.5%, not exceeding 0.1%, not exceeding 0.05%, and not exceeding 0.01%, of the base value.

For example, the fourth pixel definition layer 22 extends along the lateral side LSr of the reflective layer 4 in the respective one of the plurality of first aperture 5, and is in direct contact with the main surface MS of the base substrate 1. The maximum height Htc of the respective one of the plurality of truncated cones (e.g., the fourth pixel definition layer 22) with respect to the main surface MS of the base substrate 1 is equal to the maximum height Hr of the reflective layer 4 with respect to the base substrate 1.

Since the reflective layer 4 is between the pixel definition structure 21 and the fourth pixel definition layer 22, light laterally emitted from the respective one of the plurality of light emitting elements 30 transmits through the fourth pixel definition layer 22, and is reflected by the reflective layer 4, which may prevent light leakage from the pixel definition structure 21 and improve the light luminous efficiency.

Figure 3H:
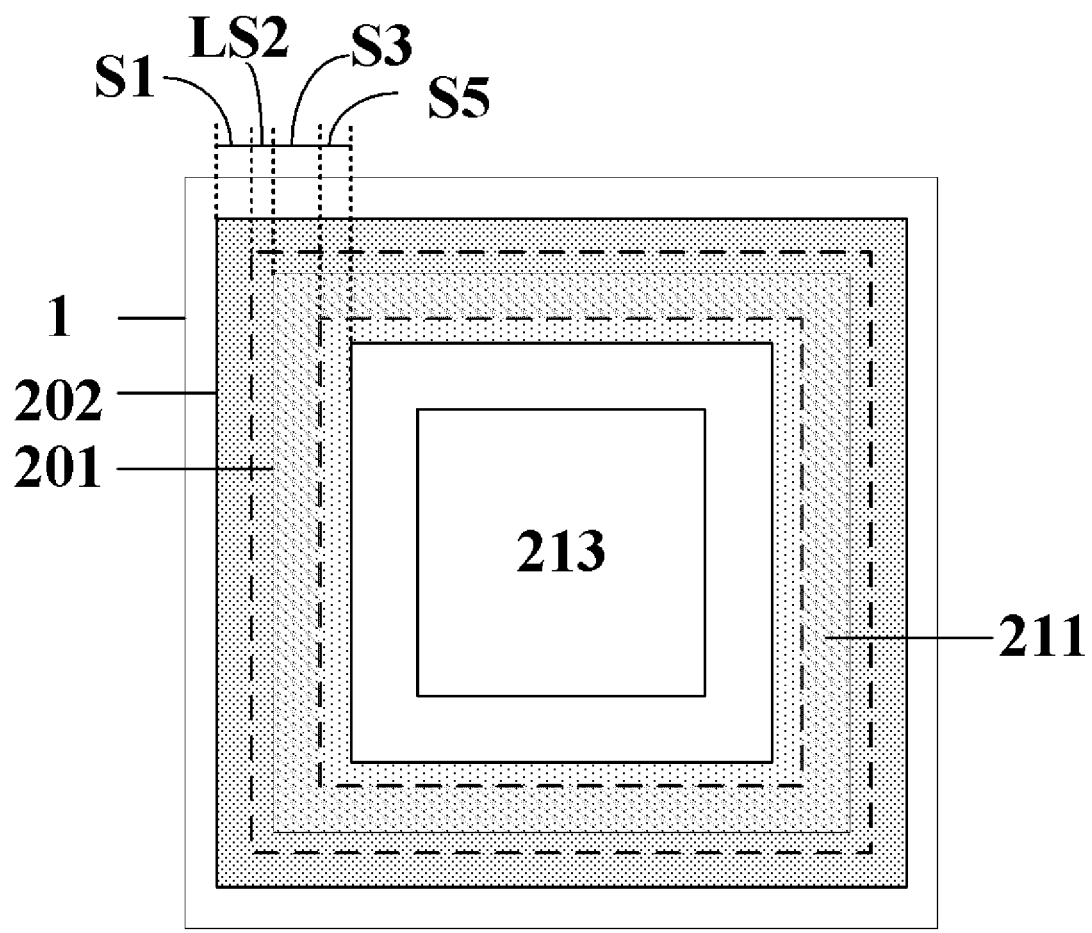
FIG. 3H is a partial plan view of a first pixel definition layer and a second pixel definition layer in some embodiments according to the present disclosure.

FIG. 3H is a partial plan view of a first pixel definition layer and a second pixel definition layer in some embodiments according to the present disclosure. Referring to FIG. 3H, a dashed line in the region corresponding first pixel definition layer 201 shows an end of the lateral side LS1 of the first pixel definition layer 201, and a dashed line in the region corresponding to the second pixel definition layer 202 shows an end of the lateral side LS2 of the second pixel definition layer 202.

In some embodiments, referring to FIG. 3A. FIG. 3B, and FIG. 3H, a portion of the first pixel definition layer 201 surrounding the respective one of the plurality of first apertures 5 is not covered by the second pixel definition layer 202, forming a ring structure 211 having a third side S3 away from the base substrate 1, a fourth side S4 opposite to the third side S3, and a fifth side S5 (e.g., lateral side SL1 of the first pixel definition layer 201) connecting the third side S3 and the fourth side S4. Optionally, the fifth side S5 (e.g., lateral side SL1 of the first pixel definition layer 201) is part of the lateral side SL of the pixel definition structure 21.

Optionally, the third side S3 and the fifth side S5 (e.g., lateral side SL1 of the first pixel definition layer 201) are at least partially covered by the reflective layer 4. In one example, the third side S3 and the fifth side S5 are partially covered by the reflective layer 4. In another example, the third side S3 and the fifth side S5 are completely covered by the reflective layer 4.

Figure 4A:
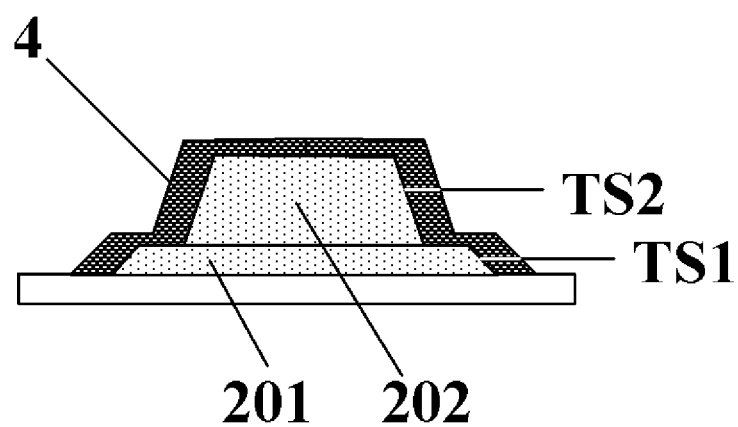
FIG. 4A is a partial cross-sectional view of a first pixel definition layer and a second pixel definition layer in an inter-subpixel region in some embodiments according to the present disclosure.
Figure 4B:
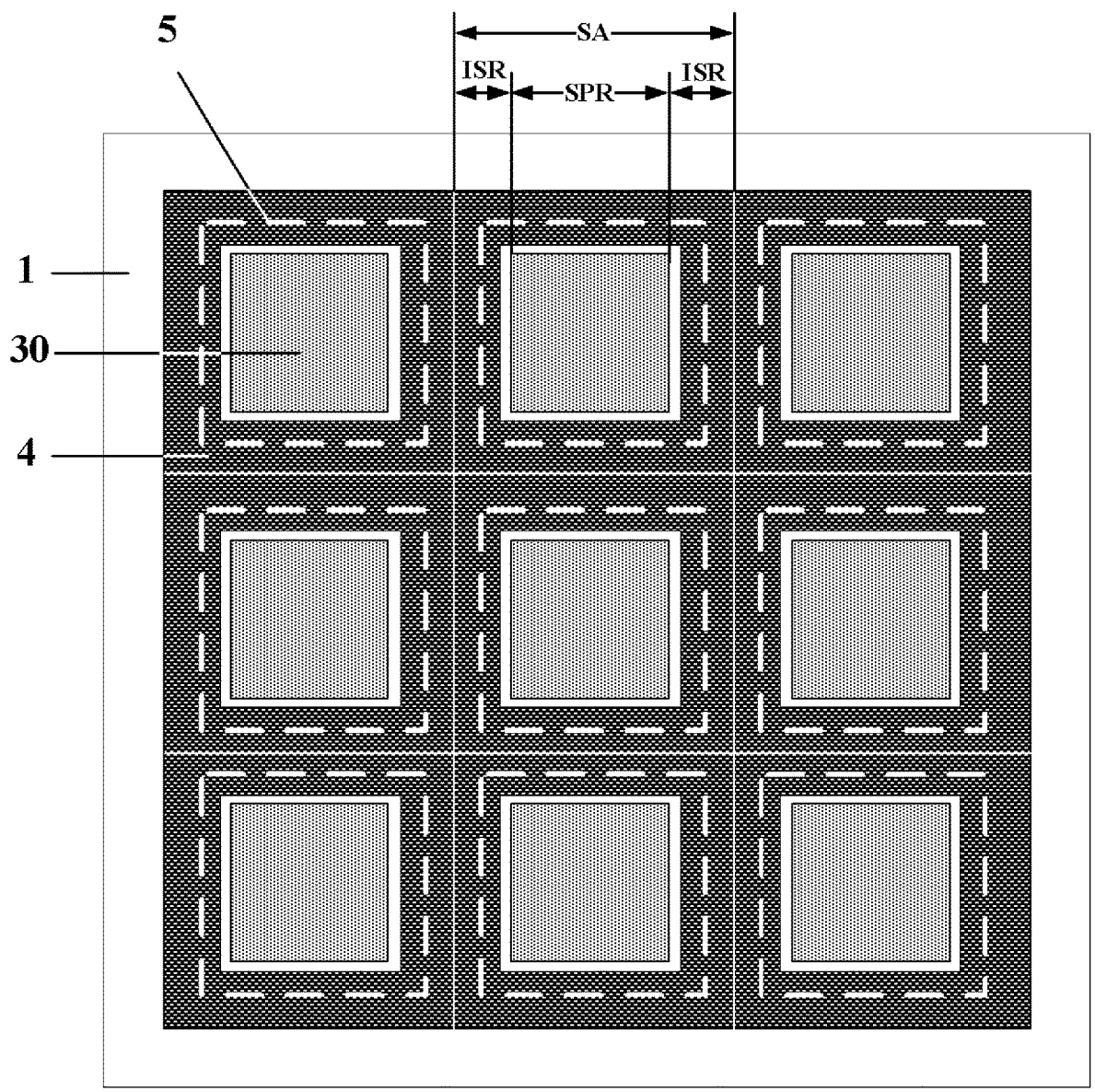
FIG. 4B is a partial plan view of a reflective layer in some embodiments according to the present disclosure.

FIG. 4A is a partial cross-sectional view of a first pixel definition layer and a second pixel definition layer in an inter-subpixel region in some embodiments according to the present disclosure. FIG. 4B is a partial plan view of a reflective layer in some embodiments according to the present disclosure. In some embodiments, referring to FIG. 4A and FIG. 4B, the reflective layer 4 is a unitary structure in the plurality of subpixels SA.

Optionally, referring to FIG. 4A, a cross-section of the first pixel definition layer 201 in the inter-subpixel region ISR between two adjacent subpixel regions have a first trapezoidal shape TS1 in a cross-sectional plane perpendicular to the main surface MS of the base substrate 1 and intersecting the main surface MS of the base substrate 1 and the light emitting surface 3. Optionally, a cross-section of the second pixel definition layer 202 in the inter-subpixel region has a second trapezoidal shape TS2 in the cross-sectional plane. Optionally, the first trapezoidal shape TS1 is stacked on the second trapezoidal shape TS2 forming a step structure. The reflective layer 4 in the cross-sectional plane has a step shape abutting the step structure. The step structure formed by the first trapezoidal shape TS1 and the second trapezoidal shape TS2 stacked together allows the reflective layer to be easily formed on the lateral side LS1 of the first pixel definition layer 201 and the lateral side LS2 of the second pixel definition layer 202.

Optionally, the cross-section of the first pixel definition layer in the inter-subpixel region ISR between two adjacent subpixel regions have a rectangular shape. Optionally, the cross-section of the second pixel definition layer in the inter-subpixel region ISR between two adjacent subpixel regions have a rectangular shape.

In some embodiments, the reflective layer 4 substantially covers the lateral side LS of the pixel definition structure (including the lateral side LS1 of the first pixel definition layer 201, the lateral side LS2 of the second pixel definition layer 202, and the exposed third side S3 of the first pixel definition layer 201), and extends to the first side S1 of the pixel definition structure to form the unitary structure.

In some embodiments, in order to increase the adhesion between the first electrode and the base substrate, the third pixel definition layer is formed between the first electrode and the base substrate. Optionally, the plurality of insulating islands includes a negative photoresist material; and the first pixel definition layer or the second pixel definition layer includes a positive photoresist material.

In some embodiments, the first pixel definition layer, the second pixel definition layer, and the third pixel definition layer are formed using a patterning process, for example, the pattern process includes sputtering, spin coating, exposing and developing, etching and stripping. Optionally, the first pixel definition layer, the second pixel definition layer, and the third pixel definition layer are formed using a same mask but different level of exposures, which can reduce cost of fabricating the display substrate described herein. For example, by adjusting the level of the exposures corresponding to different layers, the third pixel definition layer are formed to have the thickness greater than the thickness of the first pixel definition layer formed using the same mask, and the third pixel definition layer is formed to have the thickness smaller than the thickness of the second pixel definition layer formed using the same mask.

Various appropriate materials and various fabricating methods may be used for making the fourth pixel definition layer. Examples of materials suitable for making the fourth pixel definition layer include, but are not limited to, substantially transparent materials and materials having low reflection index. For example, the fourth pixel definition layer is form by curing substantially transparent resin materials or substantially transparent colloid materials.

As used herein, the term "substantially transparent" means at least 50 percent (e.g., at least 60 percent, at least 70 percent, at least 80 percent, at least 90 percent, and at least 95 percent) of an incident light in the visible wavelength range transmitted therethrough.

Various appropriate materials may be used for making the base substrate. Examples of materials suitable for making the base substrate include, but are not limited to, glass, quartz, polyimide, and polyester, etc. For example, the base substrate is a glass substrate.

In another aspect, the present disclosure also provides a display apparatus. In some embodiments, the display apparatus includes the display substrate described herein, and one or more integrated circuits connected to the display substrate. Examples of appropriate display apparatuses include, but are not limited to, an electronic paper, an OLED display panel, a mobile phone, a tablet computer, a television, a monitor, a notebook computer, a digital album, a GPS, etc.

In another aspect, the present disclosure also provides a method of fabricating the display substrate described herein. In some embodiments, the method includes forming a pixel definition structure on a base substrate defining a plurality of first apertures respectively in a plurality of subpixels; forming a plurality of light emitting elements respectively in the plurality of first apertures; and forming a reflective layer at least partially in a respective one of the plurality of first apertures and configured to reflect light laterally emitted from a respective one of the plurality of light emitting elements to exit from a light emitting surface of the respective one of the plurality of light emitting elements. Optionally, forming the pixel definition structure includes forming a first pixel definition layer on the base substrate, and forming a second pixel definition layer on a side of the first pixel definition layer away from the base substrate. Optionally, lateral sides of the first pixel definition layer and the second pixel definition layer have different slope angles with respect to a main surface of the base substrate.

In some embodiments, the method of fabricating the display substrate includes forming a base substrate; forming a third pixel definition layer including a plurality of insulating islands on the base substrate; forming a first pixel definition structure on the base substrate defining a plurality of first apertures respectively in a plurality of subpixels, and the plurality of insulating islands is formed respectively in the plurality of first apertures; forming a reflective layer at least partially in a respective one of the plurality of first apertures and configured to reflect light laterally emitted from a respective one of the plurality of light emitting elements to exit from a light emitting surface of the respective one of the plurality of light emitting elements; and forming a plurality of light emitting elements respectively in the plurality of first apertures. Optionally, a same mask plate is used for forming the first pixel definition layer, forming the second pixel definition layer, and forming the third pixel definition layer. Optionally, the third pixel definition layer is formed using a negative photoresist material; and the first pixel definition layer and the second pixel definition layer are formed using a positive photoresist material. Optionally, the third pixel definition layer is formed using a positive photoresist material; and the first pixel definition layer and the second pixel definition layer are formed using a negative photoresist material.

In some embodiments, forming the first pixel definition structure includes forming a first pixel definition layer on the base substrate; and forming a second pixel definition layer on a side of the first pixel definition layer away from the base substrate. Optionally, lateral sides of the first pixel definition layer and the second pixel definition layer are formed to have different slope angles with respect to a main surface of the base substrate.

In some embodiments, the method of fabricating the display substrate further includes forming a fourth pixel definition layer having a plurality of truncated cones respectively in the plurality of first apertures. Optionally, forming the plurality of light emitting elements include forming a first electrode on a side of a respective one of the plurality of insulating islands away from the base substrate, and in the respective one of the plurality of first apertures; forming light emitting layer on a side of the first electrode away from the respective one of the plurality of insulating islands; and forming the second electrode on a side of the light emitting layer away from the first electrode. Optionally, the respective one of the plurality of truncated cones is formed between the reflective layer and the respective one of the plurality of insulating islands, and between the reflective layer and the first electrode.

In some embodiments, the method of fabricating the display substrate includes forming a fourth pixel definition layer having a plurality of truncated cones respectively in the plurality of first apertures.

Optionally, forming the first pixel definition structure includes forming a first pixel definition layer on the base substrate; and forming a second pixel definition layer on a side of the first pixel definition layer away from the base substrate.

Optionally, forming the plurality of light emitting elements includes forming a first electrode on a side of a respective one of the plurality of insulating islands away from the base substrate, and in the respective one of the plurality of first apertures; forming light emitting layer on a side of the first electrode away from the respective one of the plurality of insulating islands; and forming the second electrode on a side of the light emitting layer away from the first electrode.

Optionally, the respective one of the plurality of truncated cones is formed between the first electrode and the reflective layer and to space apart the reflective layer and the first electrode. Optionally, the first pixel definition layer, the second pixel definition layer, and the third pixel definition layer are formed using a same mask.

In some embodiments, prior to forming the first pixel definition layer, a third pixel definition layer is formed.

Figure 5:
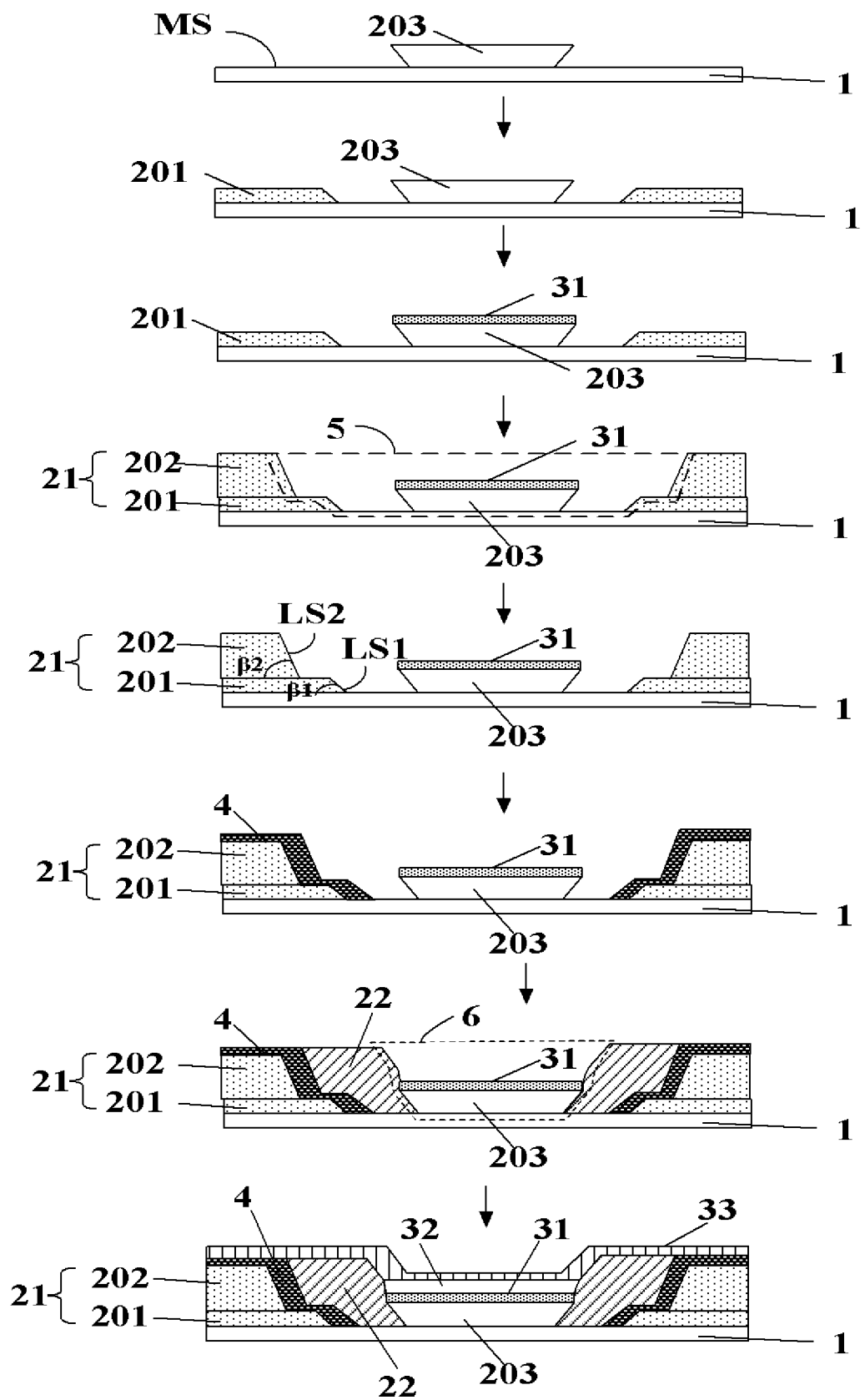
FIG. 5 is a flow chart illustrating a method of fabricating a display substrate in some embodiments according to the present disclosure.

FIG. 5 is a flow chart illustrating a method of fabricating a display substrate in some embodiments according to the present disclosure. In some embodiments, referring to FIG. 3A and FIG. 5, forming the third pixel definition layer 203 having the plurality of insulating islands on the base substrate 1 includes using a glass base substrate. Optionally, the base substrate 1 can be a flexible base substrate. The third pixel definition layer 203 is formed to enhance the adhesion between the first electrode 31 and the base substrate 1.

Optionally, prior to forming the third pixel definition layer 203, a layer having one or more integrated circuits is formed on the base substrate 1.

Optionally, the third pixel definition layer 203 is formed using a first mask. Optionally, the third pixel definition layer 203 is formed using a negative photoresist material.

In some embodiments, the first pixel definition layer 201 is formed on the base substrate 1 using the first mask and using a positive photoresist material.

In some embodiments, the first electrode 31 of the respective one of the plurality of light emitting elements is formed on a side of the third pixel definition layer 203 away from the base substrate 1. Optionally, the first electrode 31 is an anode.

Various appropriate patterning methods may be used for forming the first electrode 31. For example, a patterning method suitable for forming the first electrode includes sputtering, spin coating, exposing and developing, etching and stripping. For example, metal can be deposited on the side of the third pixel definition layer 203 away from the base substrate to form a metal material layer, and the metal material layer is etched to form the first electrode 31.

In some embodiments, the second pixel definition layer 202 is formed on aside of the first pixel definition layer 201 away from the base substrate 1 using the first mask and using a positive photoresist material. The first pixel definition layer 201 and the second pixel definition layer 202 are stacked together to form the pixel definition structure 21 to define a plurality of first apertures 5.

In one example, prior to forming the first pixel definition layer 201 and the second pixel definition layer 202, the third pixel definition layer 203 is formed, which may help to form a flat surface of the second pixel definition layer 202 away from the base substrate 1, and allow layers easily formed on a side of the second pixel definition layer 202 away from the base substrate 1.

In another example, subsequent to forming the first pixel definition layer 201 and the second pixel definition layer 202, the third pixel definition layer 203 is formed.

Optionally, an orthographic projection of the first pixel definition layer 201 on the base substrate 1 covers an orthographic projection of the second pixel definition layer 202 on the base substrate 1.

Optionally, the first pixel definition layer 201 is formed to have a lateral side LS1, and the second pixel definition layer 202 is formed to have a lateral side LS2. Optionally, a slope angle β2 of the lateral side LS2 of the second pixel definition layer 202 with respective to a main surface MS of the base substrate 1 is in a range of 50 degrees to 70 degrees. Optionally, a different between the slope angle (32 of the lateral side LS2 of the second pixel definition layer 202 with respect to the main surface MS of the base substrate 1 and a slope angle β1 of the lateral side LS1 of the first pixel definition layer 201 with respect to the main surface MS of the base substrate 1 is in a range of 0 degree to 50 degrees, e.g., 0 degree to 10 degrees, 10 degree to 20 degrees, 20 degree to 30 degrees, 30 degree to 40 degrees, and 40 degree to 50 degrees, which allows the reflective layer 4 to reflect light back to the light emitting surface 3. Optionally, the slope angle β1 of the lateral side LS1 of the first pixel definition layer 201 is in a range of 30 degrees to 80 degrees, e.g., 30 degrees to 40 degrees, 40 degrees to 50 degrees, 50 degrees to 60 degrees, 60 degrees to 70 degrees, and 70 degrees to 80 degrees, which allows the reflective layer 4 to reflect light back to the light emitting surface 3.

Optionally, the first pixel definition layer 201, the second pixel definition layer 202, and the third pixel definition layer 203 are formed using a same mask (e.g., the first mask) but different level of exposures, which can reduce cost of fabricating the display substrate described herein. By adjusting the level of the exposures corresponding to different layers, the third pixel definition layer are formed to have the thickness greater than the thickness of the first pixel definition layer formed using the same mask, the third pixel definition layer are formed to have the thickness smaller than the thickness of the second pixel definition layer formed using the same mask.

In one example, the third pixel definition layer 203 is formed using a negative photoresist material, and the first pixel definition layer 201 and the second pixel definition layer 202 are formed using a positive photoresist material. A level of exposure applied to the third pixel definition layer 203 is less than a level of exposure applied to the first pixel definition layer 201, so that the third pixel definition layer 203 are formed to have the thickness greater than the thickness of the first pixel definition layer 201 formed using the same mask. The level of exposure applied to the third pixel definition layer 203 is greater than a level of exposure applied to the second pixel definition layer 202, so that the third pixel definition layer 203 is formed to have the thickness smaller than the thickness of the second pixel definition layer 202 formed using the same mask.

In another example, the third pixel definition layer 203 is formed using a positive photoresist material, and the first pixel definition layer 201 and the second pixel definition layer 202 are formed using a negative photoresist material.

In some embodiments, a reflective layer 4 is formed at least partially in a respective one of the plurality of first apertures 5 and configured to reflect light laterally emitted from a respective one of the plurality of light emitting elements to exit from a light emitting surface of the respective one of the plurality of light emitting elements.

Optionally, the reflective layer 4 is formed to be a substantially continuous layer, and a lateral boundary at least partially defining the respective one of the plurality of first apertures in the respective one of the plurality of subpixels substantially surrounds the reflective layer 4.

Optionally, the reflective layer 4 is formed at least partially on a lateral side (e.g., LS1 and LS2) of the pixel definition structure 21. Optionally, the reflective layer 4 is formed to extend from the lateral side (e.g., LS1 and LS2) at least partially onto a first side of the pixel definition structure 21 away from the base substrate 1.

Various appropriate materials may be used for making the reflective layer. Examples of materials suitable for making the reflective layer include, but are not limited to, Al, AlNd, which may avoid adverse effect of a wet etching process on the first electrode 31.

In some embodiments, the fourth pixel definition layer 22 is formed to have a plurality of truncated cones respectively in the plurality of first aperture, and to define a plurality of subpixel aperture 6. Optionally, the respective one of the plurality of truncated cones is formed between the reflective layer 4 and the respective one of the plurality of insulating islands (e.g., the third pixel definition layer 203), and between the reflective layer and the first electrode.

Various appropriate materials may be used for forming the fourth pixel definition layer 22. Examples of materials suitable for making the fourth pixel definition layer 22 include, but are not limited to, resin, polyimide, silicone or silicon dioxide.

Optionally, a maximum height of the respective one of the plurality of truncated cones (e.g., the fourth pixel definition layer 22) with respect to a main surface MS of the base substrate 1 is equal to or less than a maximum height of the reflective layer 4 with respect to the base substrate 1.

In some embodiments, a light emitting layer 32 is formed on a side of the first electrode 31 away from the base substrate, and a second electrode 33 is formed on a side of the light emitting layer 32 away from the base substrate 1.

Optionally, the light emitting layer 32 is formed using a vacuum evaporation process or an inkjet printing process. For example, a hole injection sub-layer (HIL), a hole transport sub-layer (HTL), an emitting material sub-layer (EML), an electron transport sub-layer (ETL), and an electron injection sub-layer (EIL) are formed using the vacuum evaporation process, by forming the hole injection sub-layer (HIL), the hole transport sub-layer (HTL), the emitting material sub-layer (EML), the electron transport sub-layer (ETL), and the electron injection sub-layer (EIL), the light emitting layer 32 are formed.

Various appropriate substantially transparent materials may be used for making the second electrode. Examples of substantially transparent materials suitable for making the second electrode include, but are not limited to, Al, Ag, Mg, and one or a combination of Al, Ag, Mg.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display substrate, comprising:
   a base substrate;
   a pixel definition structure on the base substrate defining a plurality of first apertures respectively in a plurality of subpixels;
   a plurality of light emitting elements respectively in the plurality of first apertures;
   a reflective layer at least partially in a respective one of the plurality of first apertures and configured to reflect light laterally emitted from a respective one of the plurality of light emitting elements to exit from a light emitting surface of the respective one of the plurality of light emitting elements; and a third pixel definition layer, wherein the third pixel definition layer comprises a plurality of insulating islands respectively in the plurality of first apertures;

wherein the pixel definition structure comprises a first pixel definition layer on the base substrate, and a second pixel definition layer on a side of the first pixel definition layer away from the base substrate;

lateral sides of the first pixel definition layer and the second pixel definition layer have different slope angles with respect to a main surface of the base substrate;

the respective one of the plurality of light emitting elements comprises a first electrode, a light emitting layer on the first electrode, and a second electrode on a side of the light emitting layer away from the first electrode; and the first electrode is on a side of a respective one of the plurality of insulating islands away from the base substrate, and in the respective one of the plurality of first apertures.

2. The display substrate of claim 1, wherein the reflective layer is a substantially continuous layer; and a lateral boundary at least partially defining the respective one of the plurality of first apertures in the respective one of the plurality of subpixels substantially surrounds the reflective layer.

3. The display substrate of claim 1, wherein a width of the respective one of the plurality of first apertures, along a cross-aperture direction across the respective one of the plurality of first apertures and between two light emitting elements directly adjacent to the respective one of the plurality of light emitting elements, increases along a direction from the base substrate to the light emitting surface.

4. The display substrate of claim 3, wherein a slope angle of a lateral side of the second pixel definition layer is in a range of 50 degrees to 70 degrees.

5. The display substrate of claim 1, wherein a thickness of the respective one of the plurality of insulating islands is less than a combined thickness of the first pixel definition layer and the second pixel definition layer;

the thickness of the respective one of the plurality of insulating islands is greater than a thickness of the first pixel definition layer; and a width of the respective one of the plurality of insulating islands, along a cross-aperture direction across the respective one of the plurality of first apertures and between two light emitting elements directly adjacent to the respective one of the plurality of light emitting elements, increases along a direction from the base substrate to the light emitting surface.

6. The display substrate of claim 1, wherein, in the respective one of the plurality of first apertures, the reflective layer is spaced apart from the respective one of the plurality of insulating islands, and spaced apart from the first electrode; and an orthographic projection of the first electrode on the base substrate substantially overlaps with an orthographic projection of the respective one of the plurality of insulating islands on the base substrate.

7. The display substrate of claim 1, further comprising a fourth pixel definition layer, wherein the fourth pixel definition layer comprises a plurality of truncated cones respectively in the plurality of first apertures, and defining a plurality of subpixel apertures; and a respective one of the plurality of truncated cones is between the reflective layer and the respective one of the plurality of insulating islands, and between the reflective layer and the first electrode.

8. The display substrate of claim 7, wherein a maximum height of the respective one of the plurality of truncated cones with respect to the main surface of the base substrate is equal to or less than a maximum height of the reflective layer with respect to the base substrate; and the respective one of the plurality of truncated cones at least partially covers a lateral side of the reflective layer and insulates the reflective layer from the first electrode.

9. The display substrate of claim 8, wherein the pixel definition structure comprises a first side away from the base substrate, a second side opposite to the first side, and a lateral side connecting the first side and the second side and defining the respective one of the plurality of first apertures; and the reflective layer is at least partially on the lateral side of the pixel definition structure.

10. The display substrate of claim 9, wherein the reflective layer extends from the lateral side at least partially onto the first side; and the maximum height of the respective one of the plurality of truncated cones with respect to the main surface of the base substrate is substantially the same as the maximum height of the reflective layer with respect to the main surface of the base substrate.

11. The display substrate of claim 1, wherein a portion of the first pixel definition layer surrounding the respective one of the plurality of first apertures is not covered by the second pixel definition layer, forming a ring structure having a third side away from the base substrate, a fourth side opposite to the third side, and a fifth side connecting the third side and the fourth side;

the third side and the fifth side are at least partially covered by the reflective layer; and the fifth side is part of a lateral side of the first pixel definition layer.

12. The display substrate of claim 1, wherein the reflective layer is a unitary structure in the plurality of subpixels;

a cross-section of the first pixel definition layer in an inter-subpixel region between two adjacent subpixel regions have a first trapezoidal shape in a cross-sectional plane perpendicular to a main surface of the base substrate and intersecting the main surface of the base substrate and the light emitting surface;

a cross-section of the second pixel definition layer in the inter-subpixel region have a second trapezoidal shape in the cross-sectional plane;

the second trapezoidal shape is stacked on the first trapezoidal shape forming a step structure; and the reflective layer in the cross-sectional plane has a step shape abutting the step structure.

13. The display substrate of claim 1, wherein the second electrode is electrically connected to the reflective layer.

14. The display substrate of claim 1, wherein the plurality of insulating islands comprises a negative photoresist material; and the first pixel definition layer comprises a positive photoresist material.

15. A display apparatus, comprising the display substrate of claim 1, and one or more integrated circuits connected to the display substrate.

16. A method of fabricating a display substrate, comprising:

forming a pixel definition structure on a base substrate defining a plurality of first apertures respectively in a plurality of subpixels;

forming a plurality of light emitting elements respectively in the plurality of first apertures;

forming a reflective layer at least partially in a respective one of the plurality of first apertures and configured to reflect light laterally emitted from a respective one of the plurality of light emitting elements to exit from a light emitting surface of the respective one of the plurality of light emitting elements; and forming a third pixel definition layer comprising a plurality of insulating islands on the base substrate and respectively in the plurality of first apertures;

wherein forming the pixel definition structure comprises forming a first pixel definition layer on the base substrate, and forming a second pixel definition layer on a side of the first pixel definition layer away from the base substrate; and lateral sides of the first pixel definition layer and the second pixel definition layer have different slope angles with respect to a main surface of the base substrate.

17. The method of claim 16, wherein a same mask plate is used for forming the first pixel definition layer, forming the second pixel definition layer, and forming the third pixel definition layer;

the third pixel definition layer is formed using a negative photoresist material; and the first pixel definition layer and the second pixel definition layer are formed using a positive photoresist material.

18. The method of claim 16, further comprising forming a fourth pixel definition layer having a plurality of truncated cones respectively in the plurality of first apertures;

wherein the respective one of the plurality of truncated cones is formed between the reflective layer and the respective one of the plurality of insulating islands, and between the reflective layer and a first electrode of a respective one of the plurality of light emitting elements.

* * * * *